United States Patent [19]
Ishii

[11] Patent Number: 5,280,643
[45] Date of Patent: Jan. 18, 1994

[54] SENSITIVITY SWITCHING CIRCUIT FOR RADIO RECEIVER

[75] Inventor: Hisao Ishii, Ashikaga, Japan

[73] Assignee: Sanyo Electric Co., Ltd., Osaka, Japan

[21] Appl. No.: 723,075

[22] Filed: Jun. 28, 1991

[30] Foreign Application Priority Data

Jun. 29, 1990 [JP] Japan .................. 2-171849

[51] Int. Cl.$^5$ .............................. H04B 1/10
[52] U.S. Cl. .................. 455/254; 455/249.1; 307/529
[58] Field of Search .............. 455/254, 234.1, 241.1, 455/253.2, 266, 249.1, 235.1, 251.1; 307/529; 328/158

[56] References Cited

U.S. PATENT DOCUMENTS 4,313,218  1/1982  O'Donnell, Jr. .............. 455/239.1
4,553,105  11/1985  Sasaki .............. 455/249.1

FOREIGN PATENT DOCUMENTS 2513042  3/1983  France .

OTHER PUBLICATIONS

"Automatic Input Attenuator For H.F. Communication Receivers", Radio and Electronic Engineer, vol. 47, No. 11, pp. 465-469, Oct. 1977.

Primary Examiner—Reinhard J. Eisenzopf
Assistant Examiner—Mark D. Wisler
Attorney, Agent, or Firm—Armstrong, Westerman, Hattori, McLeland & Naughton

[57] ABSTRACT

An RF signal received by an antenna is amplified in an amplifier circuit and is then tuned in a tuned circuit to pick up a signal having a certain frequency and a certain level. Then, the picked up signal is mixed with another signal to output an IF signal and the IF signal is detected to reproduce the desired broadcasting program. An AGC circuit ensures high and low levels of the received signal to make the received signal to a certain level. Further, a damping circuit capable of switching a damping amount by a sensitivity switching signal is arranged in the rear stage of the AGC circuit. Hence, intensity of a signal for performing a detection or the like can be exactly switched based of the sensitivity switching signal in an automatic broadcasting station selection.

4 Claims, 3 Drawing Sheets

SENSITIVITY SWITCHING CIRCUIT FOR RADIO RECEIVER

BACKGROUND OF THE INVENTION

Field of the invention

The present invention relates to a sensitivity switching circuit for a radio receiver having an AGC (automatic gain control) circuit.

Description of the Related Art

Conventionally, many radio receivers are provided with an automatic broadcasting station selector to be operated by one touch. That is, by pushing an automatic station selection button arranged on an operational panel of a radio receiver body, receiving frequencies are automatically changed, and at a frequency (of a broadcasting signal) of which a field strength of a received radio signal is more than a predetermined value, the frequency change is stopped. Consequently, receiver broadcasting stations can be changed in consecutive order at every pushing of the automatic station selection button.

However, in this automatic station selection system, when there is no broadcasting station in the neighborhood, it is desired to successively select relatively weak radio signal transmitted by far away broadcasting stations. On the other hand, when there are many broadcasting stations in the neighborhood, it is demanded to select only relatively strong radio signal of good sound quality, and in this case, relatively strong noises occur. Hence, in the automatic broadcasting station selection, the noise is sometimes selected.

Accordingly, in the conventional radio receivers, a Lo (short distance) /DX (long distance) change switch is provided. In the Lo mode, a stop level in the automatic broadcasting station selection can be raised so as to perform the station selection only when the receiving radio signal strength is fairly strong.

In FIG. 1, there is shown a conventional radio receiver including a Lo/DX sensitivity switching circuit. In the drawing, an RF (radio frequency) signal is received by an antenna 1 and is applied to a damping circuit 2 for damping the RF signal and an RF amplifier circuit 3 for amplifying the RF signal through a capacitor 1a. Usually, an FET is used for the RF amplifier circuit 3. To the RF amplifier circuit 3, a tuned circuit 4 for picking up an RF signal having a certain frequency, a mixer 5 for mixing an output signal of the tuned circuit 4 with an output signal of a local oscillator (not shown) to output an intermediate frequency (IF) signal, an IF amplifier circuit 6 for amplifying the IF signal and a detector circuit 7 for detecting an amplified IF signal to reproduce an audio signal are successively connected in series. That is, from the broadcasting RF signal received by the antenna 1, an RF signal having the desired frequency is picked up and is then converted into the IF signal, and then the IF signal is amplified and then detected to reproduce the audio signal.

The damping circuit 2 includes a capacitor 2a and two pin diodes 2b and 2c whose respective anode and cathode are connected to the capacitor 2a. By applying a certain current to the anode of the pin diode 2c, the two pin diodes are switched on, and a part of the RF signal received by the antenna 1 is passed to the ground to carry out damping.

Further, to the output of the mixer 5, a level detector circuit 8 for detecting the level of the output signal of the mixer 5 is connected, and a detected value by the level detector circuit 8 is fed to an AGC driver circuit 9. The AGC driver circuit 9 controls the RF amplifier circuit 3 and the damping circuit 2 so that the output signal of the level detector circuit 8 may be a predetermined level. That is, in case of a relatively small amplification factor control, the AGC driver circuit 9 sends a control signal to the RF amplifier circuit 3 to control an amplification factor. Then, when the receiving signal strength becomes more than a predetermined value, currents are applied to the two pin diodes of the damping circuit 2 to impart a certain damping to the received RF signal prior to the RF amplifier circuit 3. As a result, saturation of the FET constituting the RF amplifier circuit 3 can be prevented.

A Lo/DX change switch 10 arranged on an operational panel of a radio receiver body is switched to control ON and OFF of a supply of current to a Lo/DX switch driver circuit 11 connected to the pin diode 2c of the damping circuit 2. When the Lo/DX change switch 10 is switched on in the Lo mode, a current is supplied from the Lo/DX switch driver circuit 11 to the pin diode 2c to switch on the damping circuit 2, and the damping circuit 2 gives a predetermined damping to the received RF signal. Hence, the signal strength of the selected broadcasting radio signal in the automatic broadcasting station selection can be substantially increased, and thus only the broadcasting stations with a strong field strength can be selected.

In the conventional sensitivity switching circuit, to the damping circuit 2, both the AGC driver circuit 9 and the Lo/DX switch driver circuit 11 are linked. Accordingly, when the Lo/DX change switch 10 is switched on in the Lo mode during the operation of the damping circuit 2 by the AGC driver circuit 9, the sensitivity can not be changed at all.

Further, in the Lo mode, even when the AGC driver circuit 9 supplies the current to the damping circuit 2, the received RF signal can not be damped. Hence, in this case, the AGC operation delay can be caused.

SUMMARY OF THE INVENTION

Accordingly, it is an object of the present invention to provide a sensitivity switching circuit for a radio receiver, free from the aforementioned defects and disadvantages of the prior art, which is capable of carrying out a damping of a predetermined sensitivity of a signal in a Lo mode while a desired AGC function is performed.

In accordance with one aspect of the present invention, there is provided a sensitivity switching circuit for a radio receiver, comprising an amplifier circuit for amplifying an RF signal to output an amplified RF signal; a damping circuit for damping the RF signal with a variable damping amount before the RF signal is input to the amplifier circuit; a tuned circuit for picking up a signal having a particular frequency from the amplified RF signal output from the amplifier circuit to output a tuned signal; an AGC circuit for detecting a level of the tuned signal output from the tuned circuit and controlling the damping amount of the damping circuit; a level damper circuit arranged outside a control loop of the AGC circuit, for damping the tuned signal output from the tuned circuit with a changeable damping amount to output a level-damped signal; and a mixer circuit for receiving the level-damped signal output from the level damper circuit and mixing another signal with the level-damped signal to obtain an intermediate frequency signal.

The damping amount of the level damper circuit can be changed according to on and off of a switch.

In another sensitivity switching circuit, the level damper circuit and the mixer circuit can be preferably integrated.

In a preferred sensitivity switching circuit, the level damper circuit controls signal currents flowing in the mixer circuit.

Further, the level damper circuit can include a pair of constant current circuits and switch the currents flowing in the mixer circuit by selecting one of the constant current circuits.

BRIEF DESCRIPTION OF THE DRAWINGS

The above and other objects, features and advantages of the present invention will more fully appear from the following description of the preferred embodiments with reference to the accompanying drawings, in which.

DESCRIPTION OF THE PREFERRED EMBODIMENTS

Figure 2:
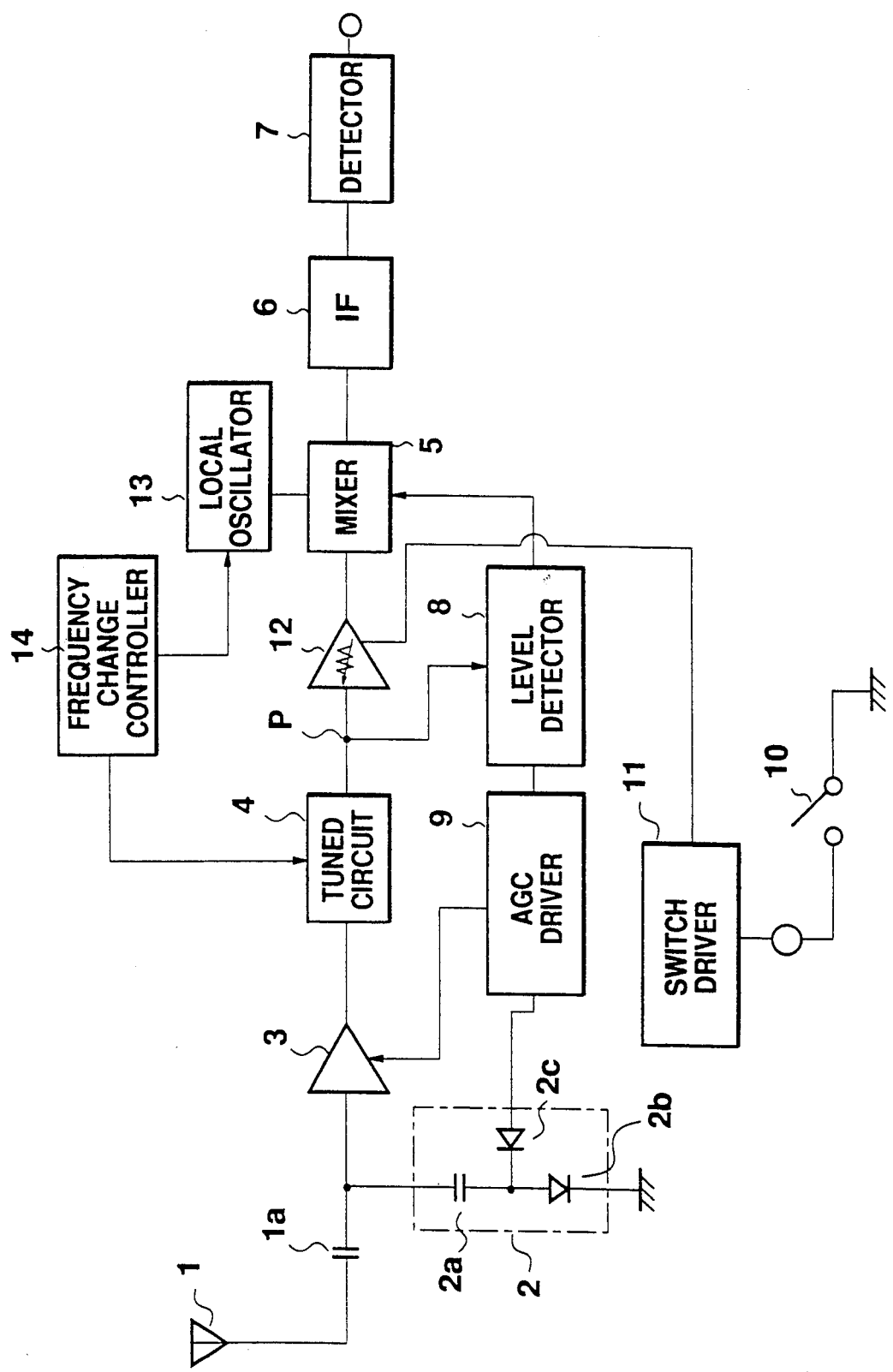
FIG. 2 is a schematic block diagram of a radio receiver including a sensitivity switching circuit according to the present invention.

Referring now to the drawings, wherein like reference characters designate like or corresponding parts throughout the several views and thus the repeated description thereof can be omitted for brevity, there is shown in FIG. 2 a radio receiver including a sensitivity switching circuit according to the present invention.

Figure 1:
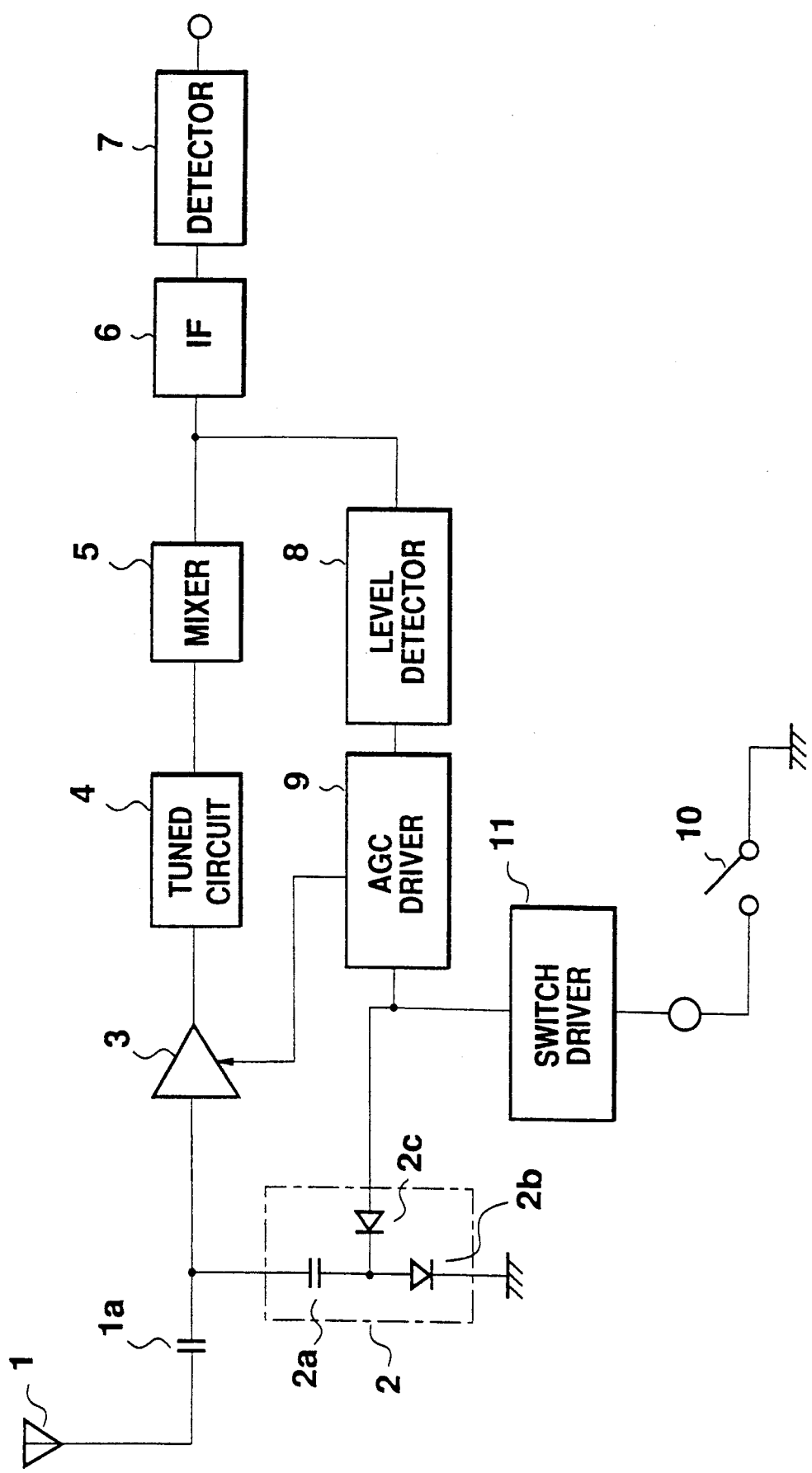
FIG. 1 is a schematic block diagram of a conventional radio receiver including a sensitivity switching circuit.

In the drawing, an antenna 1, a damping circuit 2, an RF amplifier circuit 3, a tuned circuit 4, a mixer 5, an IF amplifier circuit 6, a detector circuit 7, a level detector circuit 8, an AGC driver circuit 9, a Lo/DX change switch 10 and a Lo/DX switch driver circuit 11 have the same structures as those of the conventional radio receiver shown in FIG. 1.

In this embodiment, a level damper 12 to be switched on or off by the Lo/DX change switch 10 in the Lo or DX mode is arranged between the tuned circuit 4 and the mixer 5, that is, the input of the level damper 12 is connected to an input point P for the signal level detection by the level detector circuit 8 after the tuner circuit 4. When the Lo/DX change switch is switched on in the Lo mode, the level damper 12 is switched on to damp the level of the signal to be input to the mixer 5. A local oscillator 13 outputs a local oscillation signal having a predetermined frequency to the mixer 5 in order to obtain an IF (intermediate frequency) signal therein. A frequency change controller 14 receives a signal from the IF amplifier circuit 6 and controls the tuning frequency of the tuned circuit 4 and the oscillation frequency of the local oscillator 13 in order to change the frequency of the signal picked up by the tuned circuit 4.

That is, in the broadcasting station selection, the frequency change controller 14 outputs predetermined signals to the tuned circuit 4 and the local oscillator 13 to control the frequency of the signal picked up by the tuned circuit 4 and the oscillation frequency of the local oscillator 13. Hence, a signal having a particular frequency is picked up from the received RF signal in the tuned circuit 4 and is then converted into an IF signal having a predetermined frequency such as 450 kHz in receiving AM (amplitude modulation) radio signal in the mixer 5. The IF signal is output from the mixer 5 to the IF amplifier circuit 6.

Further, in the automatic broadcasting station selection, the frequency of the signal picked up from the received RF signal is consecutively varied with, for instance, every 9 kHz in receiving the AM radio signal in the tuned circuit 4, and at this time the level of the output signal of the IF amplifier circuit 6 is detected in the frequency change controller 14. When the detected level is at least a predetermined threshold value, the frequency of the signal is fixed to the detected frequency, and the broadcasting station selection is carried out. On the other hand, when the detected level is less than the predetermined threshold value, the frequency of the signal is changed to a next one, and this operation is repeated.

In this embodiment, the level damper 12 is arranged before the mixer 5 as described above, and the ON-OFF control of the level damper 12 is carried out by the Lo/DX change switch 10 mounted on the operational panel of the receiver body. When the Lo/DX change switch 10 is switched on in the Lo mode, the level damper 12 is switched on, and the level of the signal to be input to the mixer 5 is damped. Hence, the threshold value for the broadcasting station selection to the received RF signal is substantially increased, and as a result, only the stations transmitting the radio signal having a strong field strength can be selected. The level damper 12 is disposed before the mixer 5. When SW 10 is turned on to select the Lo mode, the SW driver 11 provides a first control signal (e.g. "H"), which actuates the level damper 12. Then, the output of the tuned circuit 4 is damped, so that only a strong electrical signal will be received.

When SW 10 is turned off to select the DX mode, the SW driver 11 provides a second control signal (e.g. "L"), which stops the operation of the level damper 12. Thereafter, the output of the tuned circuit 4 is applied to the mixer 5 without being damped, thereby permitting the reception of the DX signal.

Figure 3:
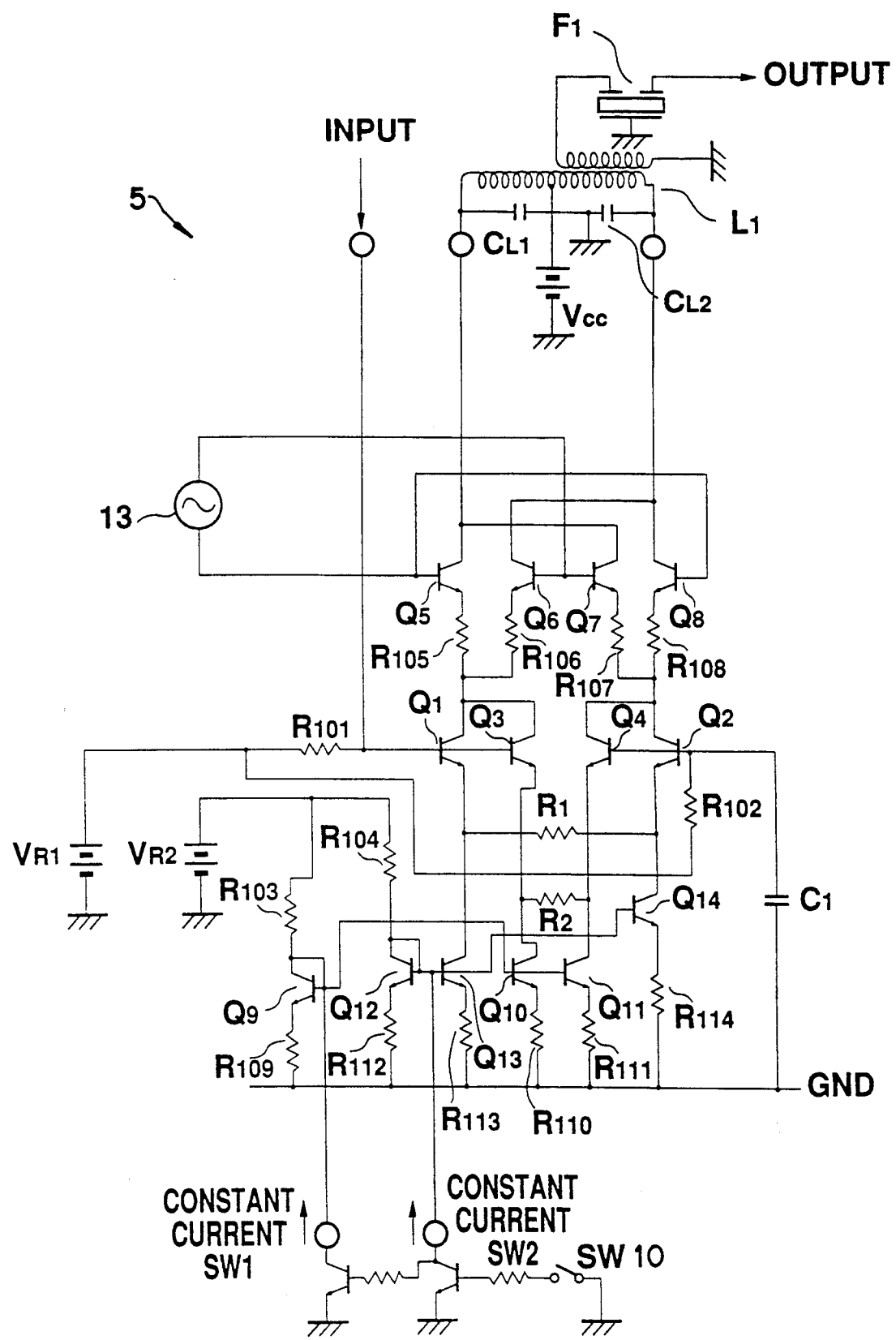
FIG. 3 is a circuit diagram of a mixer including a level damper therein for a sensitivity switching circuit for a radio receiver according to the present invention.

In FIG. 3, there is shown a circuit of a mixer 5 including a level damper 12 for a sensitivity switching circuit for a radio receiver according to a second embodiment the present invention. In this second embodiment, the signal output from the tuned circuit 4 is input to bases of four transistors $Q_1$, $Q_2$, $Q_3$ and $Q_4$, and the local oscillation signal output by the local oscillator 13 is input to bases of four transistors $Q_5$, $Q_6$, $Q_7$ and $Q_8$. There are provided six transistors $Q_9$, $Q_{10}$, $Q_{11}$, $Q_{12}$, $Q_{13}$ and $Q_{14}$ for supplying constant currents, and two resistors $R_1$, and $R_2$ for determining level of the output signal of the mixer 5 are connected between the emitters of the two transistors $Q_1$, and $Q_2$ and between the emitters of the two transistors $Q_3$ and $Q_4$, respectively.

A first reference voltage $V_{R1}$ is applied to the bases of the two transistors $Q_1$, and $Q_3$, through a resistor $R_{101}$, and to the bases of the two transistors $Q_2$ and $Q_4$ through a resistor $R_{102}$, and a second reference voltage $V_{R2}$ is applied to the bases of the three transistors $Q_9$, $Q_{10}$, and $Q_{11}$ through a resistor $R_{103}$ and to the bases of the three transistors $Q_{12}$, $Q_{13}$ and $Q_{14}$ through a resistor $R_{104}$.

The emitters of the six transistors $Q_9$, $Q_{10}$, $Q_{11}$, $Q_{12}$, $Q_{13}$ and $Q_{14}$ are connected to the ground GND through resistors $R_{109}$, $R_{110}$, $R_{111}$, $R_{112}$, $R_{113}$ and $R_{114}$, respectively. The collectors of the two transistors $Q_9$ and $Q_{12}$ are coupled with the respective bases thereof. The collectors of the two transistors $Q_{10}$ and $Q_{11}$ are connected to the emitters of the two transistors $Q_3$ and $Q_4$, respectively, and the collectors of the two transistors $Q_{13}$ and $Q_{14}$ are connected to the emitters of the two transistors $Q_1$ and $Q_2$, respectively. The bases of the two transistors $Q_2$ and $Q_4$ are linked to the ground GND via a capacitor $C_1$.

The collectors of the two transistors $Q_1$ and $Q_3$ are connected to each other and also to the emitters of the two transistors $Q_5$ and $Q_6$ through respective resistors $R_{105}$ and $R_{106}$, and the collectors of the two transistors $Q_2$ and $Q_4$ are connected to each other and also to the emitters of the two transistors $Q_7$ and $Q_8$ through respective resistors $R_{107}$ and $R_{108}$. The collectors of the two transistors $Q_5$ and $Q_7$ are linked to one end of a first coil member of a coil $L_1$, and the collectors of the two transistors $Q_6$ and $Q_8$ are connected to the other end of the first coil member. A pair of capacitors $C_{L1}$ and $C_{L2}$ are coupled in series between the one end and the other end of the first coil member, and a voltage Vcc is applied to the midpoint of the first coil member for adjusting the end voltages of the first coil member. As shown in FIG. 3, the coupling point of the capacitor $C_{L1}$ to $C_{L2}$ is grounded. From a second coil member of the coil L1 through a ceramic filter $F_1$, an IF signal formed in the mixer 5 is output.

Now, the signal output from the local oscillator 13 is applied to the bases of the four transistors $Q_5$ to $Q_6$ where the signals output from the collectors of the two transistors $Q_1$ and $Q_2$ or $Q_3$ and $Q_4$ are mixed.

Then, by applying a certain voltage from a constant current switch $SW_1$ or $SW_2$ to the bases of the group of the three transistors $Q_9$, $Q_{10}$ and $Q_{11}$ or $Q_{12}Q_{13}$ and $Q_{14}$, respectively, the transistors $Q_9$, $Q_{10}$ and $Q_{11}$ or $Q_{12}$, $Q_{13}$ and $Q_{14}$ are switched on. The transistors $Q_{10}$ and $Q_{11}$ together with the transistor $Q_9$ constitute a current mirror circuit, and the transistors $Q_{13}$ and $Q_{14}$ together with the transistor $Q_{12}$ also constitute a current mirror circuit. Hence, by selecting either the constant current switches $SW_1$ or $SW_2$ to apply the voltage, either the transistors $Q_{10}$ and $Q_{11}$ or $Q_{13}$ and $Q_{14}$ can be switched on to flow the currents therein.

Since the transistors $Q_1$ and $Q_2$ are switched on in a first state of which the transistors $Q_{13}$ and $Q_{14}$ are switched on, the level of the output signal of the mixer 5 is determined by the resistor $R_1$ connected between the emitters of the transistors $Q_1$ and $Q_2$. On the other hand, since the transistors $Q_3$ and $Q_4$ are switched on in a second state of which the transistors $Q_{10}$ and $Q_{11}$ are switched on, the level of the output signal of the mixer 5 is determined by the resistor $R_2$ connected between the emitters of the transistors $Q_3$ and $Q_4$.

Therefore, by making the values of the resistors $R_1$, and $R_2$ different from each other, the level of the output signal of the mixer 5 can be changed. For example, by making the value of the resistor $R_1$ small compared with that of the resistor $R_2$, the signal level in the first state can be enlarged compared with that in the second state. In the circuit of FIG. 3, the mixer 5 includes the level damping function.

Turning-on of SW 1 follows the opening of SW 10, which causes the turning-off of the transistor of SW 2. When SW 2 is turned off, transistors $Q_{12}$, $Q_{13}$ and $Q_{14}$ will be turned on. Then $Q_1$ and $Q_2$ will be turned on. When $R_1$ is used, amplification will be enhanced. Then, when SW 10 is closed, the transistor of SW 1 will be off. Furthermore SW 2 is turned on, then transistors $Q_9$, $Q_{10}$ and $Q_{11}$ will be turned on, and $Q_3$ and $Q_4$ is turned on. Then $R_2$ becomes active, so the amplification will be reduced. The damper 12 shown in FIG. 2 is unnecessary and therefore omitted from the second embodiment, shown in FIG. 3, because mixer 5 includes the level damper circuitry, thereby carrying out the desired sensitivity switching.

As described above, in the second embodiment, shown in FIG. 3 an ON-OFF circuit for damping the signal according to the ON or OFF of the Lo/DX change switch 10 is also included in the mixer as shown in FIG. 3, and no separate level damper 12 which is shown in FIG. 2 is required.

In a sensitivity switching circuit for a radio receiver according to the present invention, as described above, a received signal is damped in a damping circuit with a variable damping amount, and the damped signal is amplified in an amplifier circuit. Then, the amplified signal is tuned in a tuned circuit to pick up a signal having the desired frequency. Further, an AGC circuit detects a level of the signal output from the tuned circuit and controls the damping amount of the damping circuit. A level damper circuit for damping the signal output from the tuned circuit with a changeable damping amount is arranged in the rear stage of the tuned circuit. The signal damped with a predetermined amount by the level damper circuit is fed to a mixer circuit.

Consequently, an RF signal received by an antenna is amplified in an amplifier circuit and is then tuned in a tuned circuit to pick up a signal having a certain frequency and a certain level. Then, the picked up signal is mixed with another signal to output an IF signal and the IF signal is detected to reproduce the desired broadcasting program. An AGC circuit ensures high and low levels of the received signal to make the received signal to a certain level. Further, a damping circuit capable of switching a damping amount is arranged in the rear stage of the AGC circuit Hence, the signal can be exactly damped on the basis of a switching signal of the Lo/DX switch.

Further, by including a level damper circuit in a mixer, a whole structure can be simplified.

As described above, in a sensitivity switching circuit for a radio receiver according to the present invention, since a damping circuit to be actuated by a switch is independently arranged in the rear state of an AGC loop, while an AGC circuit is actuated with the desired function, by switching on in a Lo mode, the desired sensitivity damping of the signal can be carried out. Further, since a level damper circuit possesses no frequency characteristic, an exact Lo/DX switching can be carried out.

Although the present invention has been described in its preferred embodiments with reference to the accompanying drawings, it readily understood that the present invention is not restricted to the preferred embodiments and that various changes and modifications can be made by those skilled in the art without departing from the spirit and scope of the present invention.

What is claimed is:

1. A sensitivity switching circuit for a radio receiver, comprising:

an amplifier circuit for amplifying an RF signal to output an amplified RF signal;

a damping circuit for damping the RF signal with a variable damping amount before the RF signal is input to the amplifier circuit;

a tuned circuit for picking up a signal having a particular frequency from the amplified RF signal output from the amplifier circuit to output a tuned signal;

an AGC circuit for detecting a level of the tuned signal output from the tuned circuit and controlling the damping amount of the damping circuit;

a switching means including a manual switch which controls a switch driver;

a level damper circuit arranged outside a control loop of the AGC circuit, for damping the tuned signal output from the tuned circuit according to an output signal from the switch driver to output a level-damped signal; and a mixer circuit for receiving the level-damped signal output from the level damper circuit and mixing another signal with the level-damped signal to obtain an intermediate frequency signal.

2. A sensitivity switching circuit according to claim 1, wherein said manual switching means is operated to switch between Lo mode and DX mode.

3. A sensitivity switching circuit according to claim 2, wherein the output signal from the manual switching means becomes a first level when the manual switching means is switched to Lo mode and the output signal from the manual switching means becomes a second level when the manual switching means is switched to DX mode, and the level-damped signal from the level damper circuit in Lo mode is smaller than the level-damped signal in DX mode.

4. A sensitivity switching circuit according to claim 1, wherein the switch driver comprises a first constant current switch and a second constant current switch, and wherein the level damper circuit includes a first differential amplifier circuit and a second differential amplifier circuit, a first constant current circuit connected to the first differential amplifier circuit as a current source, a second constant current circuit connected to the second differential amplifier circuit as a current source, the first constant current circuit and the second constant current circuit being selectively driven by the first and second constant current switches which are controlled by the manual switch.

* * * * *